(12) United States Patent
Porret et al.

(10) Patent No.: US 7,251,466 B2
(45) Date of Patent: Jul. 31, 2007

(54) TELEVISION RECEIVER INCLUDING AN INTEGRATED BAND SELECTION FILTER

(75) Inventors: Alain-Serge Porret, Sunnyvale, CA (US); Pierre Favrat, Milpitas, CA (US); Dominique Python, Sunnyvale, CA (US); Didier Margairaz, San Jose, CA (US)

(73) Assignee: Xceive Corporation, Santa Clara, CA (US)

( * ) Notice: Subject to any disclaimer, the term of this patent is extended or adjusted under 35 U.S.C. 154(b) by 441 days.

(21) Appl. No.: 10/923,595

(22) Filed: Aug. 20, 2004

(65) Prior Publication Data

US 2006/0040628 A1    Feb. 23, 2006

(51) Int. Cl.
*H04B 1/18* (2006.01)

(52) U.S. Cl. .................. 455/190.1; 455/285; 455/302; 455/266; 455/340

(58) Field of Classification Search ............. 455/179.1, 455/180.1, 180.2, 180.3, 183.1, 188.1, 188.2, 455/190.1, 191.1, 191.2, 180.4, 193.2, 193.3, 455/285, 302, 307, 323–324, 266, 339–340; 348/731; 333/175–176, 24 C, 167; 327/553, 327/554, 557

See application file for complete search history.

(56) References Cited

U.S. PATENT DOCUMENTS

| 5,478,773 | A   | 12/1995 | Dow et al.  |
| 6,236,847 | B1  | 5/2001  | Stikvoort   |
| 6,535,722 | B1  | 3/2003  | Rosen et al.|
| 6,614,093 | B2  | 9/2003  | Ott et al.  |
| 6,714,776 | B1  | 3/2004  | Birleson    |
| 6,750,734 | B2* | 6/2004  | Utsunomiya et al. ...... 333/17.1 |
| 6,762,656 | B1  | 7/2004  | Kobayashi et al. |
| 6,823,292 | B2* | 11/2004 | Spencer ...................... 702/190 |
| 2003/0030497 | A1 | 2/2003 | Duncan et al. |

(Continued)

FOREIGN PATENT DOCUMENTS

EP    1 296 456 A2    3/2003

(Continued)

OTHER PUBLICATIONS

International Search Report, 16 pages.

(Continued)

*Primary Examiner*—Nguyen T. Vo
(74) *Attorney, Agent, or Firm*—Patent Law Group LLP; Carmen C. Cook (57) ABSTRACT

A tuner circuit includes a band selection filter coupled to receive an input RF signal and provide a band selected output signal where the band selection filter includes a bank of band pass filters. Each band pass filter includes an inductor and a variable capacitor forming an LC resonator where the inductor is an integrated planar spiral inductor. The tuner circuit further includes a frequency conversion circuit coupled to receive an input signal corresponding to the band selected output signal and provide a frequency converted output signal having a predetermined frequency. The integrated planar spiral inductor can be formed using a single metal spiral or multiple metal spirals. In a multi-spiral structure, a first metal spiral having an inward spiral pattern and a second metal spiral having an outward spiral pattern to form an inductor with large inductance, low series resistance and high Q values, even at low frequency.

41 Claims, 7 Drawing Sheets

U.S. PATENT DOCUMENTS

| | | | |
|---|---|---|---|
| 2003/0210122 A1 | 11/2003 | Concord et al. | |
| 2005/0024544 A1* | 2/2005 | Waight et al. | 348/731 |
| 2005/0156700 A1* | 7/2005 | Chang | 336/200 |

FOREIGN PATENT DOCUMENTS

| | | |
|---|---|---|
| EP | 1 416 642 A2 | 5/2004 |
| FR | 2 612 017 | 3/1987 |

OTHER PUBLICATIONS

Joachim N. Burghartz et al., "Multilevel-Spiral Inductors Using VLSI Interconnect Technology," IEEE Electron Device Letters, vol. 17, No. 9, Sep. 1996, pp. 428-430.

Kirk B. Ashby, et al., "High Q Inductors for Wireless Applications in a Complementary Silicon Bipolar Process," IEEE Journal of Solid Circuits, vol. 31, No. 1., Jan. 1996, pp. 4-9.

* cited by examiner

TELEVISION RECEIVER INCLUDING AN INTEGRATED BAND SELECTION FILTER

FIELD OF THE INVENTION

The invention relates to a television signal receiver, and, in particular, to a television signal receiver including an integrated band selection filter.

DESCRIPTION OF THE RELATED ART

A television (TV) or video recorder includes a television signal receiver (or television receiver) to receive terrestrial broadcast, cable television or satellite broadcast television signals and to process the television signals into the appropriate video signals for display or for recording. Television signals are transmitted in analog or digital formats and in accordance with a variety of standards.

The operation of a television receiver includes two main components. First, the receiver receives the incoming television signal in radio frequency (RF) and converts the incoming RF signal to an intermediate frequency (IF) signal. Then, the receiver converts the IF signal to a video baseband signal and an audio baseband signal. The baseband signals are coupled to appropriate video and audio decoders to generate the display video signals (e.g. RGB) or sound. To accomplish this, a television receiver typically includes a tuner module for performing the frequency conversion operation to generate the IF signal. The television receiver also includes a channel filter and a demodulator for converting the IF signal to video and audio baseband signals.

Figures 1, 2:
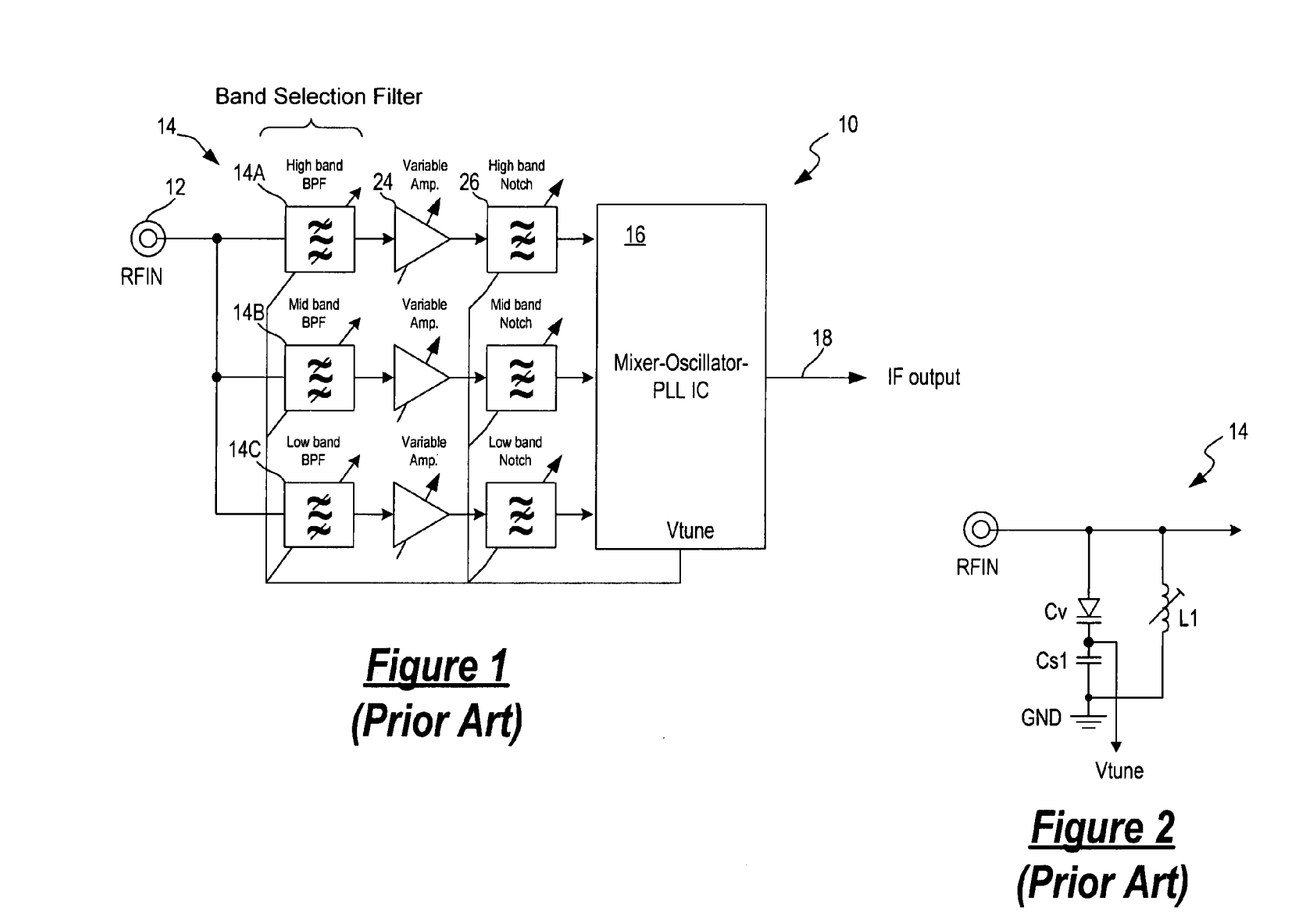
FIG. 1 is a schematic diagram of a conventional tuner module for a television receiver.
FIG. 2 illustrates the circuit diagram for a conventional band pass filter which can be used to implement the band selection filter in the tuner module of FIG. 1.

The tuner module in a television receiver receives the input RF signal from the RF connector and converts the RF signal to an IF signal by one or more frequency conversions. The frequency conversions are generally implemented as single or dual super-heterodyne conversions. FIG. 1 is a schematic diagram of a conventional tuner module for a television receiver. Referring to FIG. 1, tuner module 10 includes a band selection filter 14 for selecting separate frequency bands of the complete transmission spectrum. Band selection filter 14 is typically formed using a bank of band pass filters (14a, 14b and 14c), each for tuning a preassigned frequency band. Each band pass filter (14a, 14b and 14c) is coupled to a respective variable amplifier 24 and then to a respective notch filter 26 for image rejection, thereby forming multiple signal paths.

In the present illustration, the transmission spectrum is split into three bands: a high frequency band, such as the UHF band in 400-700 MHz, a mid frequency band, such as the VHF band in 200-400 MHz, and a low frequency band in 50-200 MHz. Thus, three band pass filters are used and three signal paths including notch filters for the respective frequency bands are formed in tuner module 10. The band selected and filtered RF signals from the three signals paths are coupled to an integrated circuit 16 that incorporates the mixer, the oscillator and the phase-locked loop (PLL) circuits. Typically, a mixer circuit is provided to each band selected and filtered RF signal that is generated at each signal path. Integrated circuit 16 processes the band selected signals into the IF signal.

In the conventional tuner module, a separate band pass filter and a separate notch filter are disposed to process the RF signal in a specific frequency band so that multiple band pass filters and multiple notch filters are required to process the entire transmission spectrum of the RF signal. FIG. 2 illustrates the circuit diagram for a conventional band pass filter 14 which can be used to implement the band selection filter in tuner module 10 of FIG. 1. The reason that separate band pass filters are needed for each frequency band is that the components (such as LC tank and varactors) used to form the band pass filter have values that are very different for low frequency than for high frequency. Therefore, separate tunable LC tanks are needed to tune the entire bandwidth. The same is true for the notch filters so that separate notch filters are provided for the different frequency bands.

In conventional TV receivers, the band pass filters used to implement the band selection function is typically formed using discrete components and is not integrated with other circuitry of the tuner module. The primary barrier to the integration of the band pass filter is the lack of high Q values integrated inductors. Most integrated inductors are of low Q values and the Q values are extremely low at low frequency. Thus, most integrated inductors available today are not suitable for tuning applications as those integrated inductors only work in a very narrow bandwidth and tuning requires a large bandwidth of operation. For example, while it is relatively easy to achieve high Q values at 800 MHz, it is extremely difficult to achieve meaningful Q values at 200 MHz using conventional integrated inductor technologies. To make adequate integrated inductor for use in tuning purposes, the integrated inductor becomes too large for practical implementation.

Another barrier to the complete integration of the tuner module of the TV receiver is the notch filter used for image rejection. Similar to the reasons that make integration of a band pass filter difficult, it is difficult to make notch filters in an integrated circuit because of the lack of high Q values integrated inductors. To have a sufficiently deep notch, such as 50 dB for image rejection, a high quality LC tank with a Q value much higher than 20 is needed. Thus, it is often not practical to integrate the notch filter into an integrated circuit.

In some TV receiver systems, the entire transmission spectrum is taken onto an integrated circuit and then processed without using a band selection filter. This approach is undesirable because the complete front-end, including the amplifiers and mixers, must be able to deal with the total power of the entire spectrum therefore requiring a large power consumption to guarantee a sufficient linearity.

SUMMARY OF THE INVENTION

According to one embodiment of the present invention, a tuner circuit receiving an input RF signal having a first transmission spectrum includes a band selection filter coupled to receive the input RF signal and provide a band selected output signal where the band selection filter includes a bank of band pass filters. Each band pass filter includes an inductor and a variable capacitor forming an LC resonator where the inductor is formed using an integrated planar spiral inductor. The tuner circuit further includes a frequency conversion circuit coupled to receive an input signal corresponding to the band selected output signal and provide a frequency converted output signal having a predetermined frequency. In one embodiment, the tuner circuit is formed as a single semiconductor integrated circuit.

The integrated planar spiral inductor can be formed using a single spiral or multiple stacked spirals. In a multi-spiral structure, a first metal spiral having an inward spiral pattern and a second metal spiral having an outward spiral pattern are used to form an inductor with large inductance, low series resistance and high Q values even at low frequency.

According to one embodiment of the present invention, a multi-spiral integrated planar inductor includes a first terminal and a second terminal and is formed in a semiconductor substrate. The inductor is formed by a first metal spiral formed in a first set of metal layers and a second metal spiral formed in a second set of metal layers, isolated from the first set of metal layers. The first metal spiral has an inward spiral pattern while the second metal spiral has an outward spiral pattern so that the two metal spirals are connected in the center of the spirals by a metal interconnect. The first and second terminals of the inductor are formed along the perimeter of the metal spirals.

According to another aspect of the present invention, a band pass filter bank for a television tuner for tuning an input RF signal having a first transmission spectrum includes a first variable amplifier having an input node coupled to receive the input RF signal and an output node providing a first output signal and multiple band pass filters connected in parallel between the output node of the first variable amplifier and a first node where the first node provides the band selected output signal of the band pass filter bank. The output signal of the first variable amplifier is selectively fed into one of the band pass filters through a set of enable switches. Each band pass filter is disposed to select a different portion of the first transmission spectrum so that the multiple band pass filters are disposed to select the entire frequency range of the first transmission spectrum. In one embodiment, each band pass filter includes a first switch coupled between the output node of the first variable amplifier and a second node, multiple switchably connected capacitors connected in parallel between the second node and a first voltage where each switchably connected capacitor includes a capacitor and a switch connected in series between the second node and the first voltage, and an inductor coupled between the second node and a second voltage where the inductor is an integrated planar spiral inductor. The inductance of the inductor and the capacitance provided by the plurality of switchably connected capacitors form an LC resonator. Each band pass filter further includes a unity gain buffer having an input node coupled to the second node and an output node coupled to the first node providing the band selected output signal. In one embodiment, the unity gain buffer is a tri-state buffer which can be turned off so that only one of the band pass filters of the bank is providing the band selected output signal to the first node.

In an alternate embodiment, the first switch and the switch in each of the multiple switchably connected capacitors is each an NMOS or PMOS transistor.

The present invention is better understood upon consideration of the detailed description below and the accompanying drawings.

DETAILED DESCRIPTION OF THE PREFERRED EMBODIMENTS

In accordance with the principles of the present invention, a television receiver includes a tuner circuit incorporating an integrated band selection filter. In one embodiment, the integrated band selection filter is implemented using a bank of integrated band pass filters incorporating integrated inductors where the integrated inductors are formed as single-spiral or multi-spiral integrated planar inductors. By using the integrated planar spiral inductor structure, an integrated inductor having sufficiently large inductance value (e.g., greater than 100 nH) with low series resistance can be formed while maintaining practical dimensions. As a result, integrated inductors of high Q values at low frequency can be achieved using processing steps and features that are common to conventional fabrication processes. By using the integrated band selection filter of the present invention, an integrated television receiver can be realized where the tuner circuit, including the band selection filter, is integrated entirely onto a single integrated circuit. Moreover, the integrated tuner circuit can be combined with other circuitry of the television receiver to form a single-chip television receiver system.

Figure 3A:
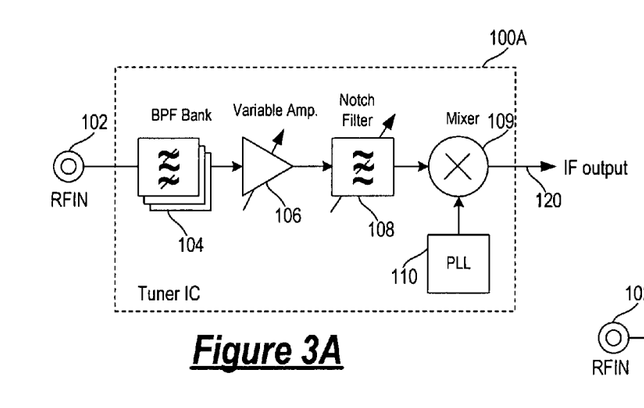
FIGS. 3A to 3C illustrate different embodiments of an integrated tuner circuit for a TV receiver which can be formed using an integrated band selection filter according to the present invention.
Figure 3B:
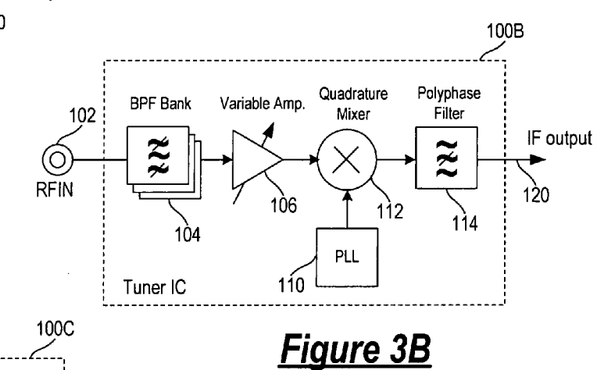
Figure 3C:
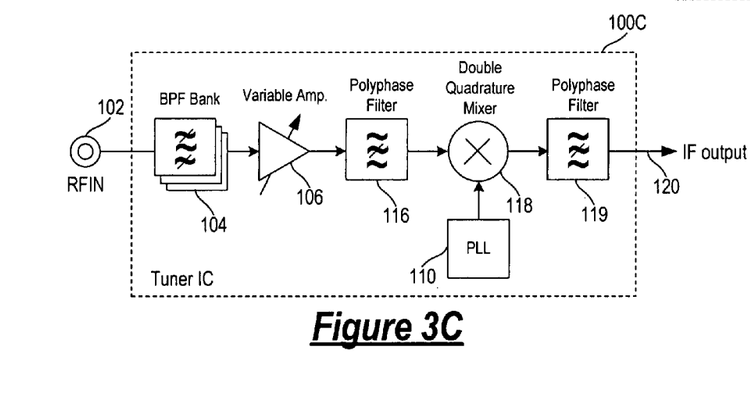

According to one aspect of the present invention, a bank of band pass filters is formed using integrated planar spiral inductors so that the bank of band pass filters can be integrated onto an integrated circuit. An integrated tuner circuit ("a tuner IC") can thus be formed using the bank of integrated band pass filters as the band selection filter. FIGS. 3A to 3C illustrate different embodiments of an integrated tuner circuit for a TV receiver which can be formed using an integrated band selection filter according to the present invention. Like elements in FIGS. 3A to 3C are given the same reference numerals to simplify the discussion.

In general, the tuner IC (100A, 100B, 100C) is coupled to a RF connector 102 to receive the incoming RF signal and provides an IF signal output on a terminal 120. The Tuner IC includes an integrated band selection filter 104 formed using a bank of integrated band pass filters (BPFs). The bank of integrated BPFs receives the full range of transmission frequency and operates to tune the incoming RF frequency to within a specific frequency band. The band selected signals are coupled to a variable amplifier 106. Variable amplifier 106 compensates the signal loss due to the LC tank in the band selection filter. Then, the amplified signal is coupled to circuitry in the tuner IC for image rejection and frequency conversions to generate the IF signal. When an integrated band selection filter is used to form the tuner IC, a single signal path can be used to process the band selected signal and the requirement for multiple signal paths is eliminated. That is, the output signals from the bank of BPFs are coupled jointly to a single variable amplifier 106. Thus, a single image rejection and frequency conversion circuit needs to be provided. The tuner circuitry can thus be greatly simplified.

As shown in FIGS. 3A to 3C, integration of the tuner circuit can be achieved in one of several ways. Referring to FIG. 3A, a notch filter 108 is included for image rejection. A mixer 109 and a phase-locked loop 110 are included for frequency conversions to generate the final IF signal. As described above, a notch filter with sufficiently large image rejection capability requires a large Q value integrated inductor. When the IF frequency is low, it may be difficult to form a sufficiently large integrated inductor. However, when the IF frequency is high, then a notch filter can be readily implemented.

FIG. 3B illustrates an alternate embodiment of the tuner IC. In FIG. 3B, image rejection is implemented using an image rejection mixer. In the present illustration, the image rejection mixer is implemented as a quadrature mixer 112 followed by a polyphase filter 114. A phase-locked loop 110 is coupled to mixer 112 to establish the desired IF frequency. The use of an image rejection mixer removes the need for a notch filter and thus makes realization of an integrated tuner IC more feasible. Tuner IC 100B typically can provide 30 dB or more of image rejection. However, with tuning and calibration, the tuner IC can achieve higher image rejection.

Finally, FIG. 3C illustrates an alternate embodiment of the tuner IC where image rejection of greater than 50 dB can be achieved without tuning or calibration. Referring to FIG. 3C, tuner IC 100C uses a double quadrature mixer 118 and two polyphase filters 116, 119 coupled before and after the mixer. A phase-locked loop 110 is coupled to mixer 118 to establish the desired IF frequency.

FIGS. 3A to 3C above illustrate exemplary embodiments of an integrated tuner circuit for a TV receiver. The configurations of the tuner IC in FIGS. 3A to 3C are illustrative only and one of ordinary skill in the art would appreciate that variations in the circuit configuration of the tuner IC are possible without departing from the scope of the present invention. For example, tuner IC 100A, 100B and 100C in FIGS. 3A to 3C each include a variable amplifier 106 coupled to the output of the band pass filter bank 104. Variable amplifier 106 is optional and may be omitted from the tuner ICs of FIGS. 3A to 3C. The output of the band pass filter bank 104 can be coupled directly to the subsequent circuit elements, such as notch filter 108, mixer 112 or polyphase filter 116. When variable amplifier 106 is included, the variable amplifier can be included at other parts of the tuner circuit for providing the necessary signal amplification or buffering, as is well understood by one of ordinary skill in the art.

Figure 4:
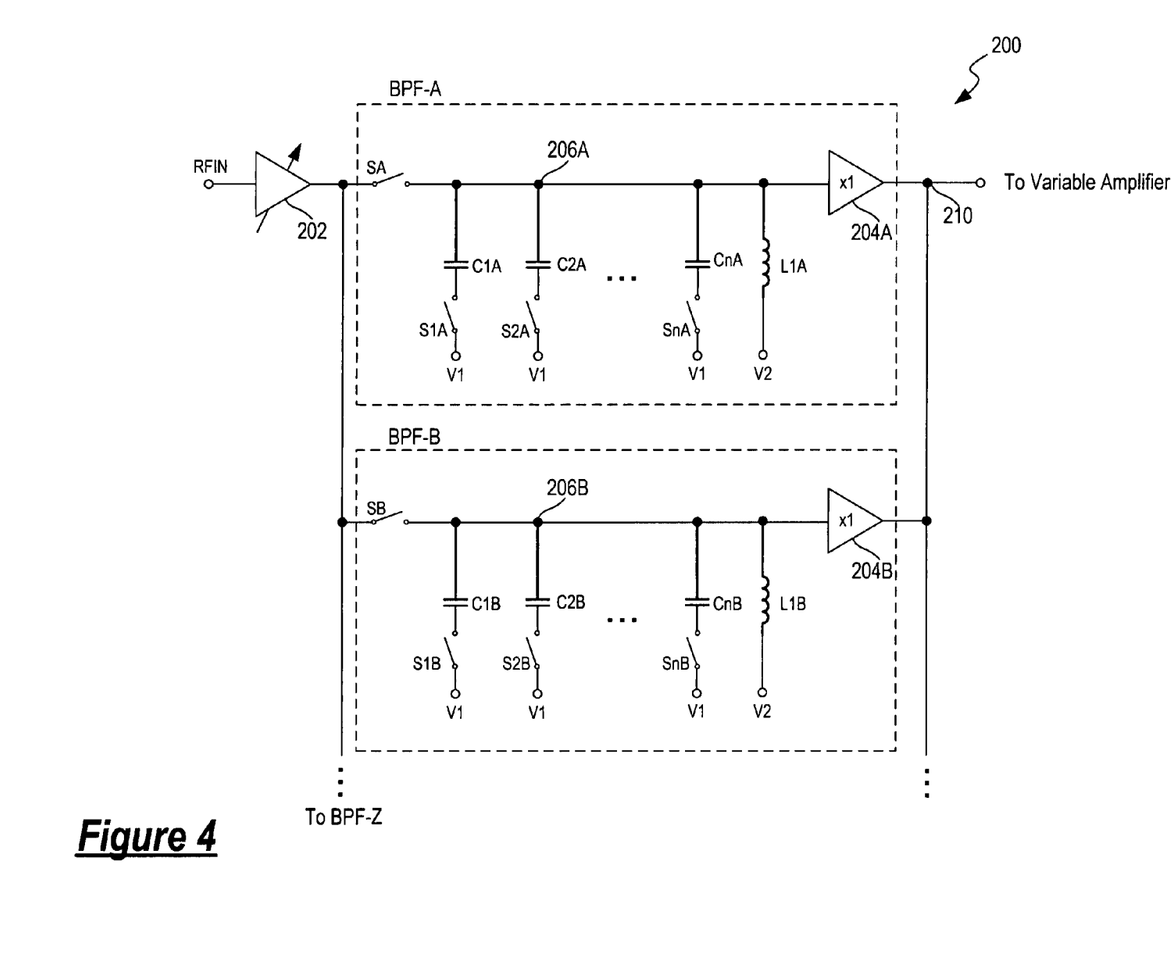
FIG. 4 is a circuit diagram of a bank of integrated band pass filters according to one embodiment of the present invention.

The salient feature of the tuner IC of FIGS. 3A to 3C is the use of integrated band selection filter 104 for frequency band selection. In accordance with the embodiments of the present invention, band selection filter 104 is formed using a bank of integrated band pass filters (BPFs) where each band pass filter incorporates an integrated inductor forming the LC tank for tuning a portion of the transmission spectrum. FIG. 4 is a circuit diagram of a bank of integrated band pass filters according to one embodiment of the present invention. The bank of integrated band pass filters can be used to form the integrated bank selection filter in the tuner ICs of FIGS. 3A to 3C.

Referring to FIG. 4, a band pass filter bank 200 includes a variable amplifier 202 coupled to the RF input connector for receiving the incoming RF signal. Band pass filter bank 200 includes multiple band pass filters BPF-A to BPF-Z connected in parallel between the output terminal of variable amplifier 202 and an output node 210. Output node 210 of band pass filter bank 200 provides the band selected signal which is usually coupled to the variable amplifier of the tuner IC (such as variable amplifier 106 of tuner ICs 100A, 100B and 100C). In operation, the variable amplifier receives the incoming RF signal and provides an output current that is selectively fed into one of the band pass filters BPF-A to BPF-Z through a set of enable switches SA to SZ coupled to each of the band pass filters.

Band pass filters BPF-A to BPF-Z are constructed in a similar manner except that each band pass filter is provided with components values (capacitance and inductance) appropriate for the specific frequency range it is designed to select. In general, band pass filter bank 200 includes a bank of integrated inductors, each integrated inductor having inductance value for selecting the specified frequency range. The bank of integrated inductors is coupled to a corresponding bank of capacitors to form LC resonators to realize the band pass filtering function.

The construction of the integrated band pass filters will be described with reference to band pass filter BPF-A. In band pass filter BPF-A, an enable switch SA is coupled between the output node of variable amplifier 202 and a node 206A. Enable switch SA is turned on, when desired, by the application of a control signal to enable band pass filter BPF-A. Band pass filter BPF-A includes a bank of capacitors C1A to CnA switchably connected in parallel between node 206A and a first voltage V1 through corresponding switches S1A to SnA. Control signals are applied to switches S1A to SnA to selectively connect one or more capacitors C1A to CnA to node 206A so that the selected capacitors contribute to the total capacitance at node 206A. When a switch S1A to SnA is open, the corresponding capacitor is not connected to voltage V1 and does not contribute its capacitance to node 206A.

Finally, band pass filter BPF-A includes an integrated inductor L1A coupled between node 206A and a voltage V2. The inductance from inductor L1A and the total capacitance contributed by the selected capacitors C1A to CnA form the LC resonator for selecting the desired frequency band from the incoming RF signal. A unity gain buffer 204A (also called a follower) has an input terminal coupled to node 206A (the common node of the capacitors and the inductor) and an output terminal being the output node 210 of bank pass filter bank 200. Unity gain buffer 204A is provided to isolate the impedance of each LC tank from output node 210 so that the input node of the subsequent circuit (such as variable amplifier 106) does not see all of the variable impedance from the LC tanks of the band pass filters.

Band pass filters BPF-B to BPF-Z are constructed in the same manner as described above with reference to band pass filter BPF-A. The band pass filter incorporating the integrated inductor of the present invention has advantages over conventional band pass filters in that varactors are used. Instead, each band pass filter includes a bank of switchably connected capacitors and an integrated inductor having different inductance values for selecting the specified frequency band. To implement band selection function for a given transmission spectrum, any number of band pass filters can be used. For instance, the bank pass filter bank can include sufficient bank pass filters to provide continuous filtering over the entire spectrum for cable reception.

In the present embodiment, the unity gain buffer in each of the band pass filters is a selectable buffer (or tri-state buffer) and can be turned off by the application of a control signal so that only one of the unity gain buffers 204A to 204Z is active at a given time. Specifically, the control signal used to control the unity gain buffer is the same control signal for controlling the enable switch in each band pass filter. Accordingly, at any given time, only one enable switch is activated to permit one band pass filter section to be activated and only the unity gain buffer associated with the selected band pass filter is activated to pass its output signal. As such, unity gain buffers 204A to 204Z operate to decouple the LC tanks of each band pass filter from the subsequent circuitry (such as variable amplifier 106) and to multiplex the signals generated by the LC tanks to a single input terminal of the subsequent circuitry. Unity gain buffers 204A to 204Z are optional and may be omitted when the subsequent circuitry to which band pass filter bank 200 is coupled includes multiple selectable input terminals. In that case, the multiple selectable input terminals provides the decoupling and multiplexing functions and unity gain buffers are not required in each band pass filter BPF-A to BPF-Z in band pass filter bank 200.

Figure 5:
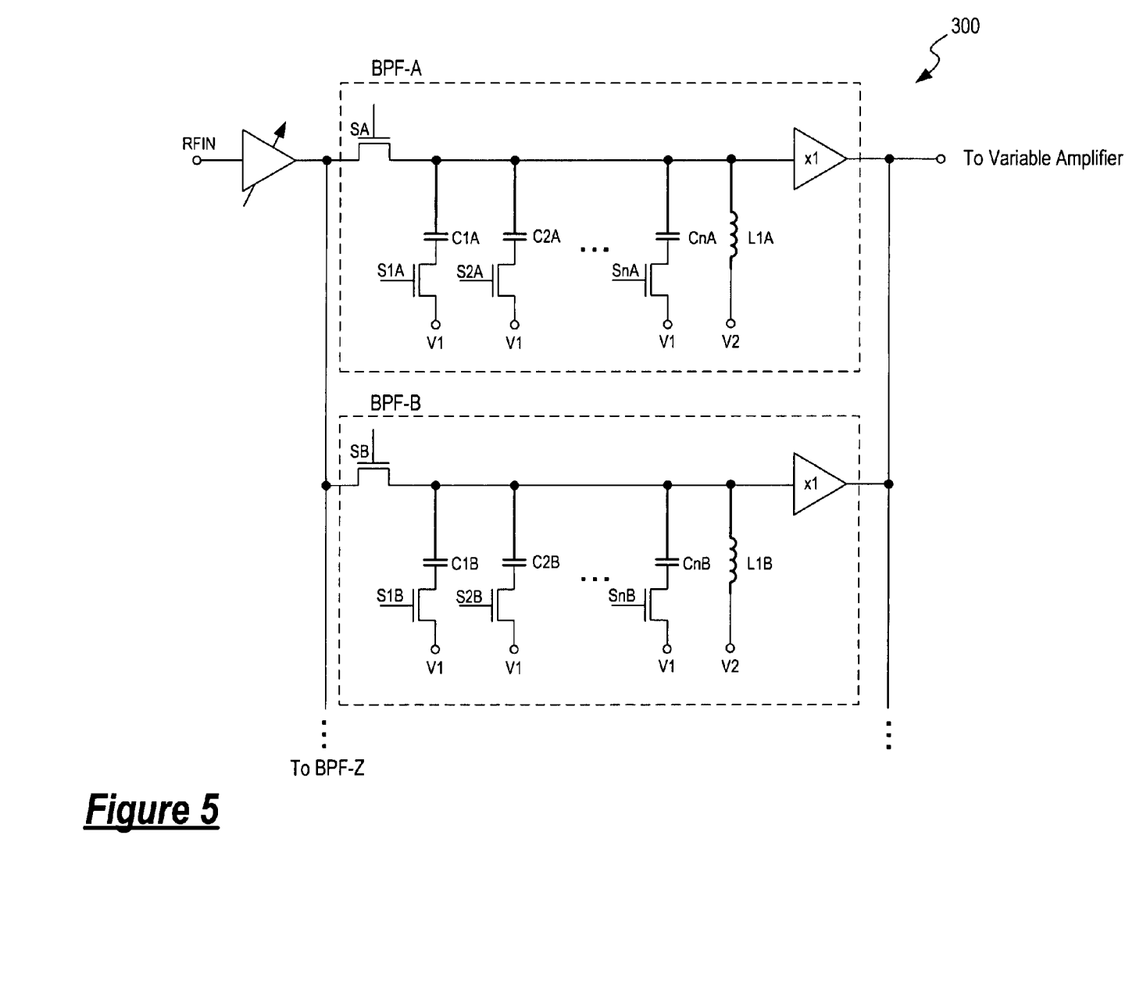
FIG. 5 is a circuit diagram of a band pass filter bank according to an alternate embodiment of the present invention.

In band pass filter bank 200, voltages V1 and V2 can be any DC voltage values. Furthermore, the enable switches (SA, SB . . . and SZ) and the capacitor switches (S1A-SnA, S1B-SnB, . . . ) can be implemented using any switch circuits, including but not limited to a PMOS transistor, an NMOS transistor and a transmission gate. FIG. 5 is a circuit diagram of a band pass filter bank 300 according to an alternate embodiment of the present invention. FIG. 5 illustrates the implementation of the band pass filter bank of FIG. 4 using NMOS transistors as the switches. In the embodiment shown in FIG. 5, voltage V1 is the ground voltage and voltage V2 is the positive power supply voltage for providing the appropriate biasing of the circuit.

Figure 8:
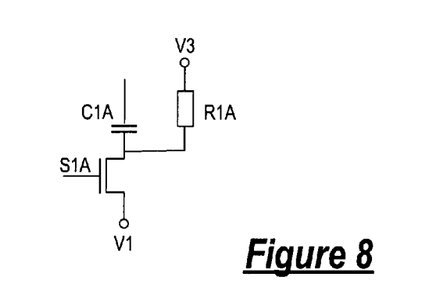
FIG. 8 is a circuit diagram of a switchably connected capacitor which can be incorporated in the band pass filter of FIG. 5 according to one embodiment of the present invention.

When MOS transistors are used as the switches (S1A-SnA, S1B-SnB, . . . ) for the capacitors in each band pass filter, the performance of the filter circuit could be enhanced by connecting the drain of each MOS transistor to a potential V3 through a resistor, as shown in FIG. 8. Referring to FIG. 8, a resistor R1A is connected to the drain terminal of NMOS transistor S1A which is also connected to capacitor C1A. The other terminal of resistor R1A is connected to a voltage V3. FIG. 8 illustrates one exemplary implementation of the switchably connected capacitor circuit and it is understood that each of the switchably connected capacitor circuits in the band pass filter bank of the present invention can be provided with a resistor connected to voltage V3 as shown in FIG. 8.

The resistance value of the resistor must be high enough so that the quality factor of the LC tank is not significantly degraded. Typically, a resistance value of larger than 100 kOhm can be used. The resistor biases the drain terminal of the MOS transistor when the transistor is turned off to a potential of V3 which is chosen so that the drain junction capacitance is minimized. To accomplish this, when NMOS transistors are used as the capacitor switches, voltage V3 must be as high as possible relative to the voltage of the bulk of the transistor. When PMOS transistors as the switches, voltage V3 must be chosen as small as possible relative to the bulk voltage of the transistor. This biasing technique reduces the minimum value of the tank capacitance that can be reached and increases the tank tuning range to higher frequencies. Also, the junction capacitance of the MOS transistors is non-linear and might introduce distortion in the signal being tuned. Reducing the value of the drain junction capacitance and reverse-biasing the drain of each MOS transistor switch with the largest possible reverse biasing voltage both contribute to limiting distortion.

Figure 9:
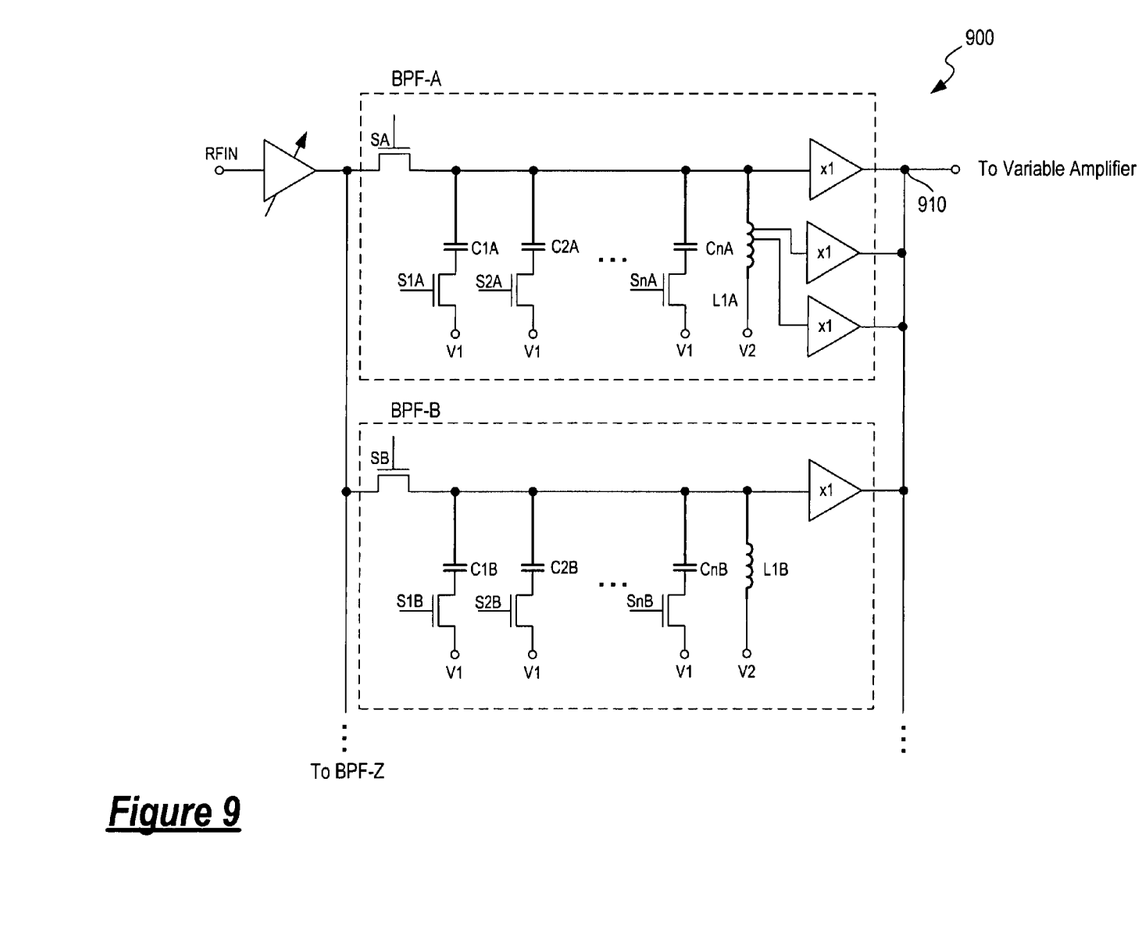
FIG. 9 is a circuit diagram of a band pass filter bank incorporating a multi-tap integrated planar inductor according to an alternate embodiment of the present invention.

In band pass filter bank 200, the impedance of the LC tank is strongly dependent on the parallel capacitance of the LC tank and therefore the impedance is strongly dependent on the resonance frequency. The gain of the front-end circuit will also vary with the tuning frequency and will be higher in the high range of the LC tank tuning range. The gain variation with respect to the tuning frequency is especially true for the low-frequency banks were the series resistance of the inductor is relatively constant with frequency. The gain variation is typically less for high-frequency tanks because of the skin effects which tend to increase the series resistance at higher frequencies. The gain variation can be corrected and made more stable by adding one or several intermediate taps to the inductor of the-low frequency banks, as shown in FIG. 9. Each tap of the inductor is coupled to its own unity-gain buffer or its own variable gain amplifier. A desired tap of the inductor can be selected corresponding to the desired gain.

Figure 10:
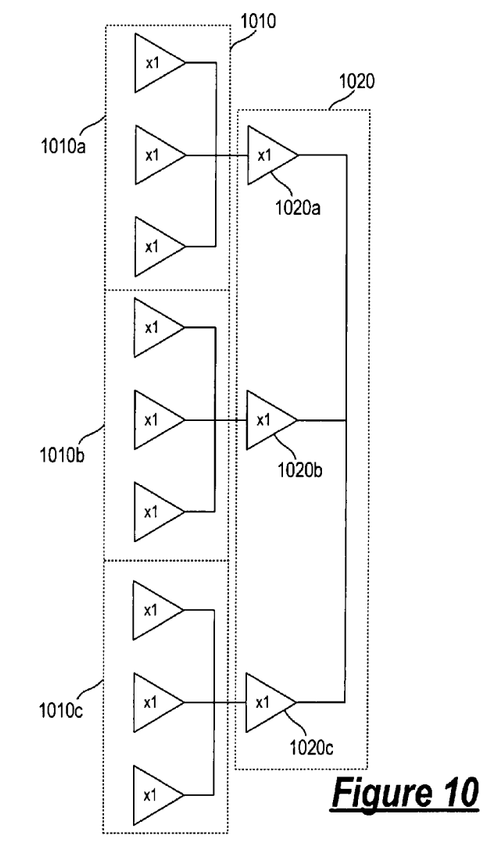
FIG. 10 is a circuit diagram of a buffer cascade which can be used in the band pass filter bank of the present invention for reducing capacitive loading at the output node.

In the band pass filter bank of FIG. 9, it may result that a very large number of unity gain buffers are connected to the output node 910. In some applications, the capacitive load at the output node might be too large. In that case, a cascade of selectable unity gain buffers can be used, as shown in FIG. 10. In the circuit of FIG. 10, a first layer 1010 of unity gain buffers is provided and each unity gain buffer in the first layer is coupled to a respective band pass filter circuit. The first layer 1010 of unity gain buffers are divided into groups (1010a, 1010b, and 1010c) where each group is coupled to a respective unity gain buffer (1020a, 1020b or 1020c) in a second layer 1020 of unity gain buffers. In this manner, the total number of unity gain buffers connected to the output node of the band pass filter bank is reduced.

According to one embodiment of the present invention, the bank of integrated inductors L1A to L1Z is formed using an integrated planar spiral inductor. While integrated inductors are known, their application in tuning has been limited because conventional integrated inductors are only suitable for narrow signal bandwidth applications. Tuning applications require inductors that can operate over a large signal bandwidth. Furthermore, conventional integrated inductors often have very low Q values and the Q values are extremely low at low frequency.

Figure 6:
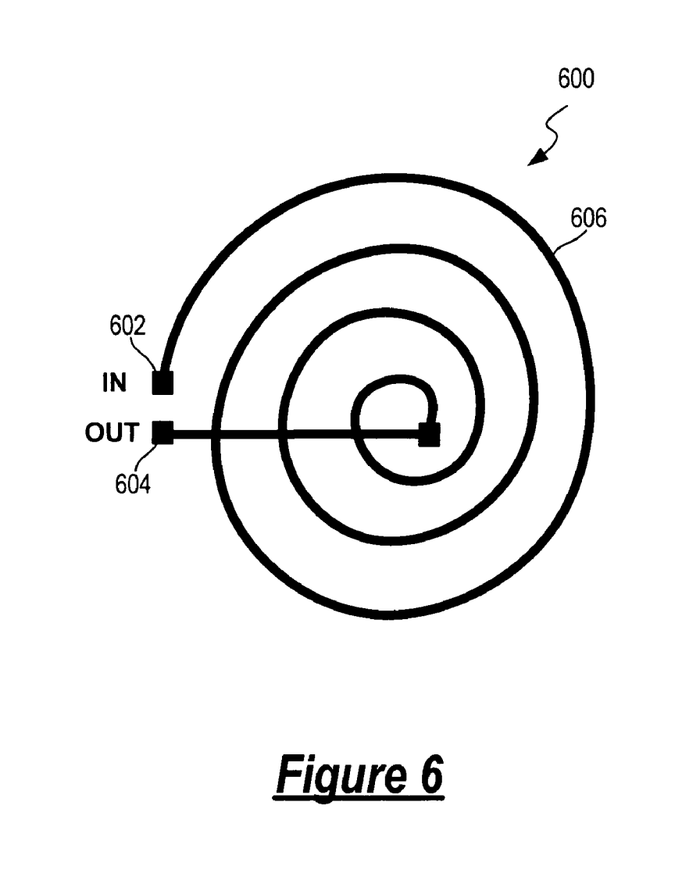
FIG. 6 is a top view of a single-spiral integrated planar inductor according to one embodiment of the present invention.

According to one embodiment of the present invention, an integrated planar spiral inductor is formed to provide large inductance values and low series resistance while achieving high Q values even at low frequencies. The integrated planar spiral inductor of the present invention can be implemented in practical dimensions even for large inductance values (such as greater than 100 nH). The integrated planar spiral inductor of the present invention can be formed as a single-spiral inductor structure or a multi-spiral inductor structure. FIG. 6 is a top view of a single-spiral integrated planar inductor according to one embodiment of the present invention while FIG. 7 is a top view of a multi-spiral integrated planar inductor according to one embodiment of the present invention.

Referring to FIG. 6, single-spiral integrated planar inductor 600 is formed using a first set of metal layers forming a metal spiral 606 having respective ends forming the two terminals 602, 604 of the inductor. The outer end 602 of inductor 600 is denoted as the input terminal. In the present embodiment, the inner end of metal spiral 606 is coupled through a metal line formed in a separate metal layer to form an output terminal 604 in the proximity of the input terminal 602. The metal line connecting the inner end to output terminal 604 is of course electrically isolated from metal spiral 606 and can be formed in metal layers above or below the metal spiral. Any conventional metal via structure can be used to connect the metal spiral to the metal line formed in different metal layers.

The number of turns used in inductor 600 determines the inductance value of the inductor. The larger number of turns, the larger the inductance value but the planar area required to implement inductor 600 also increases. For large inductance value, a single-spiral planar inductor is sometimes not desirable as a large parasitic capacitance value to the substrate is inherent in a large planar inductor structure. According to another aspect of the present invention, a multi-spiral integrated planar inductor is formed so that an inductor of large inductance value can be formed in a small area, resulting in reduced parasitic capacitance and thus larger Q values.

Figure 7:
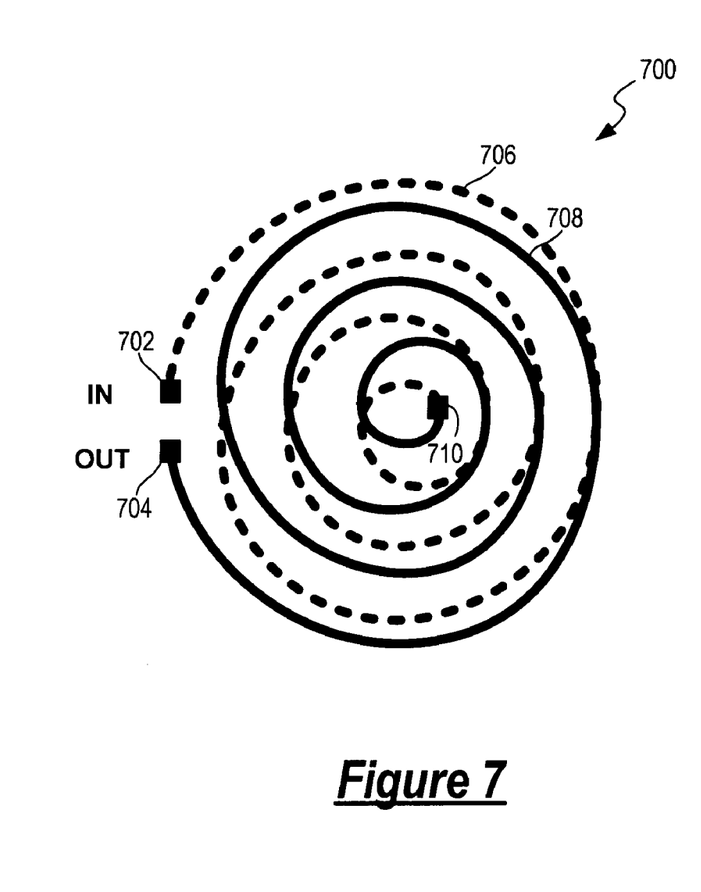
FIG. 7 is a top view of a multi-spiral integrated planar inductor according to one embodiment of the present invention.

Referring to FIG. 7, a multi-spiral integrated planar inductor 700 is formed using two sets of metal layers separated by a dielectric layer (not shown). The first set of metal layers is used to form a first metal spiral 706 while the second set of metal layers is used to form a second metal spiral 708. Second metal spiral 708 is formed on top of and overlies first metal spiral 706. Second metal spiral 708 is isolated from the first metal spiral by the dielectric layer. The two terminals of integrated inductor 700 are depicted as an input node 702 and an output node 704. Metal spiral 706 and metal spiral 708 are connected in series so that the inductance value of inductor 700 is determined by the total number of turns in metal spiral 706 and metal spiral 708.

The salient feature of integrated inductor 700 is the spiral directions of the first and second metal spirals. Specifically, first metal spiral 706 spirals inward from the outer end (input node 702) at the perimeter of the spiral to the inner end (a center node 710) in the center of the spiral. Center node 710 is a metal interconnect via that connects the first set of metal layers to the second set of metal layers. Then, second metal spiral 708 spirals outward from center node 710 to output node 704 at the perimeter of the spiral. In this manner, first metal spiral 706 and second metal spiral 708 are connected in series between the two terminals of the inductor and are formed on top of each other to yield an inductor having suitably large inductance value. Inductor 700 can be used to provide inductance values that are high enough to operate at low frequencies (less than 500 MHz) and particularly at frequencies as low as 200 MHz. As compared to conventional integrated inductors, integrated inductor 700 can provide inductance values that are four times larger than the conventional integrated inductors having the same dimensions.

The spiral-in and spiral-out nature of the metal spirals forming the integrated inductor of the present invention has particular advantages in that metal line cross-over is completely avoided. In inductor 700 of the present invention, the two terminals of the inductor is formed at the perimeter of the metal spirals thus no metal line crossing over the metal spirals is required to form the two inductor terminals.

By forming two planar spiral inductor on top of each other, the total area required to implement a large inductance value inductor is drastically reduced. In one embodiment, a multi-spiral inductor can be formed using only one-fourth of the area required for a single-spiral inductor of the same inductance value. Because only one metal spiral is formed on the substrate surface, the parasitic capacitance of inductor 700 is also reduced significantly as compared to a single-spiral planar inductor of the same inductance value.

When integrated inductors 600 and 700 are formed using metal layers in conventional semiconductor fabrication processes, it is important to reduce the series resistance of the inductors introduced by the metal layers used to form the spirals. In the present embodiment, integrated planar spiral inductors 600 and 700 are formed using metal layers that are thicker and wider than the standard metal layers in the fabrication process. In one embodiment, the first and second sets of metal layers used to form inductors 600 and 700 have a thickness of 3 µm and a line width of 5-10 µm to reduce the series resistance of the metal lines to an acceptable level. Each set of metal layers can be formed by combining two or more metal layers of the fabrication process so that the metal spiral has a large total thickness.

In FIGS. 6 and 7, the metal spirals are formed in a circular shape. The circular shape is illustrative only and is not intended to be limiting. In other embodiments, the metal spirals can be formed using a square, a rectangular shape, an octagonal shape or other suitable shapes. Furthermore, inductor 700 is formed using only two metal spirals. In other embodiments, the integrated inductor of the present invention can be formed using multiple metal spirals stacked on top of each other. Basically, each pair of metal spirals can be characterized as having an outer end at the perimeter of the spiral and an inner end at the center of the spiral. An odd spiral has a inward spiral pattern from the outer end to the inner end while an even spiral has an outward spiral pattern from the inner end to the outer end. By connecting alternating odd and even spirals in series, an inductor of any inductance value can be formed using a relatively small silicon area. Specifically, a stack of metal spirals can be formed as follows: the inner end of the first odd spiral is connected to the inner end of the first even spiral while the outer end of the first even spiral is connected to the outer end of the second odd spiral, and so on. When even number of metal spirals is used, the two terminals of the inductor are always provided at the perimeter of the spirals so that metal cross-over is avoided. For example, a second pair of odd-even metal spirals can be stacked on the two metal spirals of FIG. 7. The input node of the second pair of metal spirals is connected to output node 704. As thus formed, input node 702 of the first pair of metal spirals and the output node of the second pair of metal spirals form the two terminals of the integrated inductor. An inductor having four metal spirals is thus formed.

The integrated planar spiral inductors described above can be formed in an integrated circuit to realize integrated inductors having large inductance values, low series resistance and low parasitic capacitance when a multi-spiral structure is used. Thus, the integrated planar spiral inductors described above can be used to form high Q inductors in an integrated circuit suitable for tuning applications.

According to another aspect of the present invention, an integrated television receiver is formed using the integrated band selection filter of the present invention. In one embodiment, an integrated television receiver includes a RF signal input terminal, an integrated band selection filter, a frequency conversion circuit for converting the input RF signal to a first IF signal. The integrated television receiver can include a second frequency conversion circuit to convert the first IF signal to a second IF, such as a preselected intermediate frequency that is fixed despite the geographic location of operation. Alternately, the integrated television receiver can include an analog to digital converter sampling the first IF signal. Subsequent processing of the first IF signal can then be carried out in the digital domain. The integrated television receiver can be built in a monolithic semiconductor chip, thereby realizing a single chip television receiver system.

In the above descriptions, the tuner IC is described as being applied in a television receiver application. Thus, the tuner IC receives an RF signal and provides an IF signal having as the output signal where the IF signal has an intermediate frequency as is generally understood by one of ordinary skill in the art. However, the tuner IC of the present invention can have applications in receiving incoming RF signals other than a television signal. In general, the tuner IC of the present invention can be used to receive any RF input signal and provide a band selected and frequency converted signal as the output signal. Furthermore, while the band pass filter bank of FIGS. 4 and 5 is described as being used for band selection in the tuner circuit of the present invention, the band pass filter bank can of course be used in other application for tuning the incoming RF single to a specific frequency band. Also, the band pass filter bank is illustrated as including multiple band pass filters connected in parallel of course, it is also possible to form a band pass filter bank including only a single band pass filter.

Figure 11:
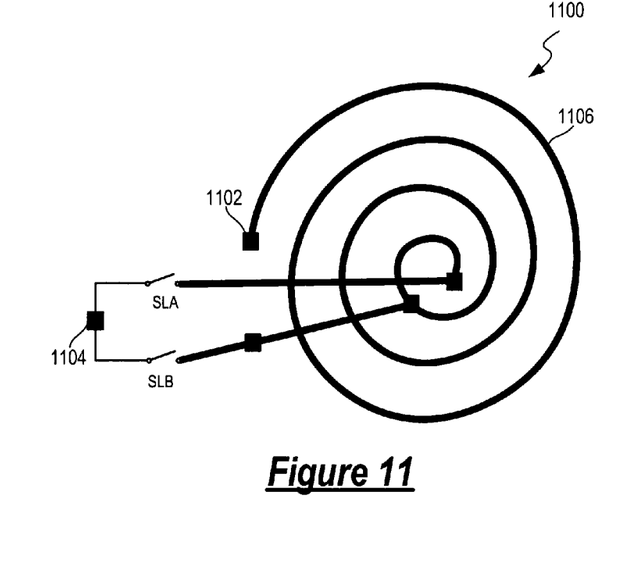
FIG. 11 is a top view of a single-spiral integrated planar inductor including selectable inductance according to one embodiment of the present invention.

As described above, a bank pass filter bank is formed using multiple band pass filters connected in parallel for tuning the entire spectrum of transmission frequency of interest. The number of band pass filters used in a bank can be reduced if the inductance value of the inductor can be selectively modified. FIG. 11 is a top view of a single-spiral integrated planar inductor with selectable inductance according to one embodiment of the present invention. Referring to FIG. 11, a first tap is made to connect the inner end of the metal spiral forming the inductor while a second tap is made at a middle-point of the metal spiral. A first switch SLA and a second switch SLB can be used to connect one of the two taps to the output terminal 1104. By selecting between one of the two taps using the switches, either the full inductance of the inductor is selected or part of the inductance is selected. Alternately, a set of taps and switches can be used to select multiple inductance values. The selectable inductance structure can be used both for single and multi-spirals inductors. The selectable inductance structure is especially useful for the low-frequency band pass filter banks where it is possible to add the switches without significantly deteriorating the characteristics of the inductor in terms of resonance frequency and quality factor.

The above detailed descriptions are provided to illustrate specific embodiments of the present invention and are not intended to be limiting. Numerous modifications and variations within the scope of the present invention are possible. The present invention is defined by the appended claims.

We claim:

1. A tuner circuit receiving an input RF signal having a first transmission spectrum, the tuner circuit comprising:
    a band selection filter coupled to receive the input RF signal and provide a band selected output signal, wherein the band selection filter comprises a plurality of band pass filters, each band pass filter comprising an inductor and a variable capacitor forming an LC resonator, the inductor of the LC resonator being formed as an integrated planar spiral inductor; and
    a frequency conversion circuit coupled to receive an input signal corresponding to the band selected output signal of the band selection filter and provide a frequency converted output signal having a predetermined frequency, wherein the band selection filter comprises:
    a first variable amplifier having an input node coupled to receive the input RF signal and an output node providing a first output signal;
    a plurality of band pass filters connected in parallel between the output node of the first variable amplifier and a first node, the first node providing the band selected output signal of the band selection filter, each band pass filter being disposed to select a different portion of the first transmission spectrum so that the plurality of band pass filters is disposed to select the entire frequency range of the first transmission spectrum; and
    each band pass filter comprising:
        a first switch coupled between the output node of the first variable amplifier and a second node;
        a plurality of switchably connected capacitors connected in parallel between the second node and a first voltage, each switchably connected capacitor comprising a capacitor and a switch connected in series between the second node and the first voltage;
        an inductor coupled between the second node and a second voltage, the inductor being an integrated planar spiral inductor, wherein the inductance of the inductor and the capacitance provided by the plurality of switchably connected capacitors form an LC resonator; and
        a unity gain buffer having an input node coupled to the second node and an output node coupled to the first node providing the band selected output signal.

2. The tuner circuit of claim 1, wherein the tuner circuit is formed as a single integrated circuit.

3. The tuner circuit of claim 1, further comprising:
    a variable amplifier coupled to receive the band selected output signal from the band selection filter and provide an amplified output signal,
    wherein the frequency conversion circuit is coupled to receive the amplified output signal of the variable amplifier as the input signal.

4. The tuner circuit of claim 1, wherein the frequency conversion circuit comprises:
    a notch filter coupled to receive the input signal corresponding to the band selected output signal and for performing image rejection filtering on the input signal to provide an image filtered output signal; and
    a mixer circuit coupled to receive the image filtered output signal from the notch filter and perform frequency conversion on the image filtered output signal to generate the frequency converted output signal having the predetermined frequency, the mixer circuit being coupled to a phase-locked loop for controlling the frequency conversion.

5. The tuner circuit of claim 1, wherein the frequency conversion circuit comprises:
    an image rejection mixer coupled to receive the input signal corresponding to the band selected output signal and for performing image rejection filtering and frequency conversion on the input signal to provide the frequency converted output signal having the predetermined frequency.

6. The tuner circuit of claim 5, wherein the frequency conversion circuit comprises:
    a quadrature mixer coupled to receive the input signal corresponding to the band selected output signal and for performing image rejection filtering and frequency conversion, the quadrature mixer providing an output signal, the quadrature mixer being coupled to a phase-locked loop for controlling the frequency conversion; and a polyphase filter coupled to receive the output signal of the quadrature mixer and providing the frequency converted output signal having the predetermined frequency.

7. The tuner circuit of claim 5, wherein the frequency conversion circuit comprises:
   a first polyphase filter coupled to receive the input signal corresponding to the band selected output signal and provide a first output signal;
   a double quadrature mixer coupled to receive the first output signal and for performing image rejection filtering and frequency conversion, the double quadrature mixer providing a second output signal, the double quadrature mixer being coupled to a phase-locked loop for controlling the frequency conversion; and
   a second polyphase filter coupled to receive the second output signal and providing the frequency converted output signal having the predetermined frequency.

8. The tuner circuit of claim 1, wherein the first switch and the switch in each of the plurality of switchably connected capacitors each comprises an NMOS or PMOS transistor.

9. The tuner circuit of claim 8, wherein each band pass filter further comprises a plurality of resistors, each resistor associated with one of the plurality of switchably connected capacitors, each resistor having a first terminal coupled to a node between the switch and the capacitor of the respective switchably connected capacitor and a third voltage.

10. The tuner circuit of claim 1, wherein the integrated planar spiral inductor comprises an integrated planar spiral inductor having selectable inductance, the inductor comprising a first terminal at a first end of the spiral inductor and a second terminal, the inductor comprising a plurality of taps coupled to different portions of the spiral inductor including a second end of the spiral inductor, each tap being coupled to the second terminal through a switch, wherein a switch is selected to select the inductance for the inductor.

11. The tuner circuit of claim 1, wherein the integrated planar spiral inductor comprises a single-spiral metal spiral inductor having an outer end as a first terminal and an inner end being coupled to form a second terminal of the inductor, the metal spiral being formed using a set of metal layers on a semiconductor substrate.

12. The tuner circuit of claim 1, wherein the integrated planar inductor comprises a multi-spiral integrated planar inductor having a first terminal and a second terminal and formed in a semiconductor substrate, the inductor comprising:
   a first metal spiral formed in a first set of metal layers connected in parallel wherein the first metal spiral has an outer end being the first terminal of the inductor and the first metal spiral spirals inward to an inner end in the center of the spiral;
   a second metal spiral formed in a second set of metal layers connected in parallel and overlying the first metal spiral, wherein the second metal spiral has an inner end in the center of the spiral and being coupled to the inner end of the first metal spiral through a metal interconnect and the second metal spiral spirals outward to an outer end being the second terminal of the inductor; and
   a dielectric layer formed between the first metal spiral and the second metal spiral isolating the first metal spiral from the second metal spiral except for the metal interconnect.

13. The tuner circuit of claim 12, wherein the first metal spiral and the second metal spiral each has a circular or octagonal shape.

14. The tuner circuit of claim 12, wherein the first metal spiral and the second metal spiral each has a square or rectangular shape.

15. The tuner circuit of claim 12, wherein the thickness of each of the first set and second set of metal layers is at least 2 μm.

16. The tuner circuit of claim 12, wherein the first set of metal layers and the second set of metal layers used to form the multi-spiral integrated planar inductor each has a line width of at least 5 μm.

17. The tuner circuit of claim 1, wherein the integrated planar inductor comprises a multi-spiral integrated planar inductor having a first terminal and a second terminal and formed in a semiconductor substrate, the inductor comprising:
   a plurality of metal spirals, each metal spiral being formed in a respective set of metal layers and each set of metal layers being isolated from the metal layers of the other spirals by a dielectric layer, the plurality of metal spirals comprising a plurality of odd metal spirals and a plurality of even metal spirals;
   each odd metal spiral of the plurality of odd metal spirals having an outer end and an inner end and an inward spiral pattern from the outer end to the inner end; and
   each even metal spiral of the plurality of even metal spirals having an outer end and an inner end and an outward spiral pattern from the inner end to the outer end,
   wherein the plurality of metal spirals comprises alternating odd metal spirals and even metal spirals connected in series to form the inductor, the inner end of an odd metal spiral being connected to the inner end of the next even metal spiral and the output end of an even metal spiral being connected to the outer end of the next odd metal spiral.

18. The tuner circuit of claim 1, wherein the inductor in a fist band pass filter of the plurality of band pass filters comprises a multi-tap integrated planar spiral inductor, the first band pass filter further comprising a plurality of unity gain buffer, a first unity gain buffer having an input node coupled to the second node and an output node coupled to the first node, and each of the remaining unity gain buffers having an input node coupled to a respective tap of the multi-tap integrated planar spiral inductor and an output node coupled to the first node.

19. The tuner circuit of claim 1, wherein the unity gain buffers in the plurality of band pass filters are divided into a plurality of groups, the output nodes of the unity gain buffers in a group being coupled together and to an input node of a respective unity gain buffer in a second set of unity gain buffers, the output nodes of the second set of unity gain buffers being coupled to the first node.

20. A band pass filter bank for a television tuner for tuning an input RF signal having a first transmission spectrum, the band pass filter bank comprising:
   a first variable amplifier having an input node coupled to receive the input RF signal and an output node providing a first output signal;
   a plurality of band pass filters connected in parallel between the output node of the first variable amplifier and a first node, the first node providing the band selected output signal of the band pass filter bank, each band pass filter being disposed to select a different portion of the first transmission spectrum so that the plurality of band pass filters is disposed to select the entire frequency range of the first transmission spectrum; and each band pass filter comprising:
- a first switch coupled between the output node of the first variable amplifier and a second node;
- a plurality of switchably connected capacitors connected in parallel between the second node and a first voltage, each switchably connected capacitor comprising a capacitor and a switch connected in series between the second node and the first voltage;
- an inductor coupled between the second node and a second voltage, the inductor being an integrated planar spiral inductor, wherein the inductance of the inductor and the capacitance provided by the plurality of switchably connected capacitors form an LC resonator; and
- a unity gain buffer having an input node coupled to the second node and an output node coupled to the first node providing the band selected output signal.

21. The band pass filter bank of claim 20, wherein the first switch and the switch in each of the plurality of switchably connected capacitors each comprise an NMOS or PMOS transistor.

22. The band pass filter bank of claim 20, wherein each band pass filter further comprises a plurality of resistors, each resistor associated with one of the plurality of switchably connected capacitors, each resistor having a first terminal coupled to a node between the switch and the capacitor of the respective switchably connected capacitor and a third voltage.

23. The band pass filter bank of claim 20, wherein the integrated planar spiral inductor comprises an integrated planar spiral inductor having selectable inductance, the inductor comprising a first terminal at a first end of the spiral inductor and a second terminal, the inductor comprising a plurality of taps coupled to different portions of the spiral inductor including a second end of the spiral inductor, each tap being coupled to the second terminal through a switch, wherein a switch is selected to select the inductance for the inductor.

24. The band pass filter bank of claim 20, wherein the integrated planar spiral inductor comprises a single-spiral metal spiral inductor having an outer end as a first terminal and an inner end being coupled to form a second terminal of the inductor, the metal spiral being formed using a set of metal layers on a semiconductor substrate.

25. The band pass filter bank of claim 20, wherein the integrated planar spiral inductor comprises a multi-spiral integrated planar spiral inductor having a first terminal and a second terminal and formed in a semiconductor substrate, the inductor comprising:
- a first metal spiral formed in a first set of metal layers wherein the first metal spiral has an outer end being the first terminal of the inductor and the first metal spiral spirals inward to an inner end in the center of the spiral;
- a second metal spiral formed in a second set of metal layers and overlying the first metal spiral, wherein the second metal spiral has an inner end in the center of the spiral and being coupled to the inner end of the first metal spiral through a metal interconnect and the second metal spiral spirals outward to an outer end being the second terminal of the inductor; and
- a dielectric layer formed between the first metal spiral and the second metal spiral isolating the first metal spiral from the second metal spiral except for the metal interconnect.

26. The band pass filter bank of claim 25, wherein the first metal spiral and the second metal spiral each has a circular or octagonal shape.

27. The band pass filter bank of claim 25, wherein the first metal spiral and the second metal spiral each has a square or rectangular shape.

28. The band pass filter bank of claim 25, wherein the first set of metal layers and the second set of metal layers used to form the multi-spiral integrated planar spiral inductor each has a thickness of at least 3 µm.

29. The band pass filter bank of claim 25, wherein the first set of metal layers and the second set of metal layers used to form the multi-spiral integrated planar spiral inductor each has a line width of at least 5 µm.

30. The band pass filter bank of claim 20, wherein the integrated planar spiral inductor comprises a multi-spiral integrated planar spiral inductor having a first terminal and a second terminal and formed in a semiconductor substrate, the inductor comprising:
- a plurality of metal spirals, each metal spiral being formed in a respective set of metal layers and each set of metal layers being isolated from another set of metal layers by a dielectric layer, the plurality of metal spirals comprising a plurality of odd metal spirals and a plurality of even metal spirals;
- each odd metal spiral of the plurality of odd metal spirals having an outer end and an inner end and an inward spiral pattern from the outer end to the inner end; and
- each even metal spiral of the plurality of even metal spirals having an outer end and an inner end and an outward spiral pattern from the inner end to the outer end,
- wherein the plurality of metal spirals comprises alternating odd metal spirals and even metal spirals connected in series to form the inductor, the inner end of an odd metal spiral being connected to the inner end of the next even metal spiral and the output end of an even metal spiral being connected to the outer end of the next odd metal spiral.

31. The band pass filter bank of claim 20 wherein an inductor in a first band pass filter of the plurality of band pass filters has an inductance value suitable for operation in a low frequency range.

32. The band pass filter bank of claim 31, wherein the low frequency range comprises frequencies that are less than 500 MHz.

33. The band pass filter bank of claim 20, wherein the inductor in a fist band pass filter of the plurality of band pass filters comprises a multi-tap integrated planar spiral inductor, the first band pass filter further comprising a plurality of unity gain buffer, a first unity gain buffer having an input node coupled to the second node and an output node coupled to the first node, and each of the remaining unity gain buffers having an input node coupled to a respective tap of the multi-tap integrated planar spiral inductor and an output node coupled to the first node.

34. The band pass filter bank of claim 20, wherein the unity gain buffers in the plurality of band pass filters are divided into a plurality of groups, the output nodes of the unity gain buffers in a group being coupled together and to an input node of a respective unity gain buffer in a second set of unity gain buffers, the output nodes of the second set of unity gain buffers being coupled to the first node.

35. A band pass filter for filtering an input RF signal, comprising:
- a first variable amplifier having an input node coupled to receive the input RF signal and an output node providing a first output signal;
- a band pass filter connected between the output node of the first variable amplifier and a first node providing the filtered output signal, the band pass filter comprising:
  - a first switch coupled between the output node of the first variable amplifier and a second node;
  - a plurality of switchably connected capacitors connected in parallel between the second node and a first voltage, each switchably connected capacitor comprising a capacitor and a switch connected in series between the second node and the first voltage;
  - an inductor coupled between the second node and a second voltage, the inductor being an integrated planar spiral inductor, wherein the inductance of the inductor and the capacitance provided by the plurality of switchably connected capacitors form an LC resonator; and
  - a unity gain buffer having an input node coupled to the second node and an output node coupled to the first node providing the filtered output signal.

36. The band pass filter of claim 35, wherein the first switch and the switch in each of the plurality of switchably connected capacitors each comprise an NMOS or PMOS transistor.

37. The band pass filter of claim 35, further comprising a plurality of resistors, each resistor associated with one of the plurality of switchably connected capacitors, each resistor having a first terminal coupled to a node between the switch and the capacitor of the respective switchably connected capacitor and a third voltage.

38. The band pass filter of claim 35, wherein the integrated planar spiral inductor comprises an integrated planar spiral inductor having selectable inductance, the inductor comprising a first terminal at a first end of the spiral inductor and a second terminal, the inductor comprising a plurality of taps coupled to different portions of the spiral inductor including a second end of the spiral inductor, each tap being coupled to the second terminal through a switch, wherein a switch is selected to select the inductance for the inductor.

39. The band pass filter of claim 35, wherein the integrated planar spiral inductor comprises a single-layer metal spiral having an outer end as a first terminal and an inner end being coupled to form a second terminal of the inductor, the metal spiral being formed using a set of metal layers on a semiconductor substrate.

40. The band pass filter of claim 35, wherein the integrated planar spiral inductor comprises a multi-spiral integrated planar spiral inductor having a first terminal and a second terminal and formed in a semiconductor substrate, the inductor comprising:
- a plurality of metal spirals, each metal spiral being formed in a respective set of metal layers and each set of metal layers being isolated from another set of metal layers by a dielectric layer, the plurality of metal spirals comprising a plurality of odd metal spirals and a plurality of even metal spirals;
- each odd metal spiral of the plurality of odd metal spirals having an outer end and an inner end and an inward spiral pattern from the outer end to the inner end; and
- each even metal spiral of the plurality of even metal spirals having an outer end and an inner end and an outward spiral pattern from the inner end to the outer end,
  - wherein the plurality of metal spirals comprises alternating odd metal spirals and even metal spirals connected in series to form the inductor, the inner end of an odd metal spiral being connected to the inner end of the next even metal spiral and the output end of an even metal spiral being connected to the outer end of the next odd metal spiral.

41. The band pass filter of claim 35, wherein the inductor in the band pass filter comprises a multi-tap integrated planar spiral inductor, the band pass filter further comprising a plurality of unity gain buffer, a first unity gain buffer having an input node coupled to the second node and an output node coupled to the first node, and each of the remaining unity gain buffers having an input node coupled to a respective tap of the multi-tap integrated planar spiral inductor and an output node coupled to the first node.

* * * * *